United States Patent [19]
Akioka et al.

[11] Patent Number: 5,661,693
[45] Date of Patent: Aug. 26, 1997

[54] MEMORY DEVICE FOR SYNCHRONOUSLY READING AND WRITING DATA

[75] Inventors: Takashi Akioka, Akishima; Noboru Akiyama, Hitachinaka; Masahiro Iwamura, Hitachi; Seigoh Yukutake, Kodaira, all of Japan

[73] Assignee: Hitachi, Ltd., Tokyo, Japan

[21] Appl. No.: 562,194

[22] Filed: Nov. 22, 1995

[30] Foreign Application Priority Data

Nov. 25, 1994 [JP] Japan .................................... 6-290896

[51] Int. Cl.$^6$ ...................................................... G11C 7/00
[52] U.S. Cl. ........................................ 365/233; 365/189.05
[58] Field of Search .............................. 365/233, 230.03, 365/189.05, 207, 208, 189.02

[56] References Cited

U.S. PATENT DOCUMENTS

| | | | |
|---|---|---|---|
| 4,928,265 | 5/1990 | Higuchi | 365/233 |
| 5,222,047 | 6/1993 | Matsuda | 365/230.03 |
| 5,258,951 | 11/1993 | Yu | 365/189.05 |
| 5,343,428 | 8/1994 | Pilo | 365/189.05 |
| 5,455,795 | 10/1995 | Nakao | 365/189.05 |

*Primary Examiner*—David C. Nelms
*Assistant Examiner*—Son Mai
*Attorney, Agent, or Firm*—Antonelli, Terry, Stout & Kraus, LLP.

[57] ABSTRACT

A synchronous memory device is provided in which the cycle time is shorter than conventional memory devices. For example, by providing an output latch in a sense amplifier on a bit line, the time period from input of a clock signal to latching data in the output latch is shortened. In case of plural bit lines, a selector for selecting data in a plural output latch and a latch for latching a sense amplifier selection are provided.

6 Claims, 10 Drawing Sheets

CONVENTIONAL DEVICE

FIG. 3 CONVENTIONAL DEVICE

CONVENTIONAL DEVICE

MEMORY DEVICE FOR SYNCHRONOUSLY READING AND WRITING DATA

BACKGROUND OF THE INVENTION

1. Field of the Invention

This invention is concerned with a memory device, and more particularly to a memory device which reads and writes data with synchronization.

2. Description of Prior Art

One problem associated with conventional memory devices, is that its cycle time (e.g., the time period between data outputs) cannot be shortened.

In order to resolve this problem, synchronous memory devices have been constructed to carry data input and output operations synchronizing in accordance with a timing signal (e.g., a clock signal provided from outside the memory device) which is different from the timing signal for specifying an address signal. FIG. 2 shows an example of the typical structure of a conventional synchronous memory device with two levels of latches. In this device, address data are latched before a decoder, and specified data are selected by a selector from data read from a memory cell according to the decoded address data. The selected data are latched before an output buffer. Data input and output is controlled by controlling the aforementioned latches in conjunction with clock signals.

FIG. 3 and FIG. 8 illustrate the typical structure of a synchronous memory device with three levels of latches which is shown in Japanese patent laid-open print 64-21786. In this device, address data are latched before a decoder and the decoded address data are latched before a memory cell array. Specified data are selected by the selector among several data read from the memory cell, and the selected data are latched before the output buffer. By controlling these three levels of latches with the clock signal, inputting and outputting of data are controlled.

Generally, the cycle time of a synchronous memory device is limited by the maximum delay time between an input latch, in which the data of an address signal and a chip selection signal are stored, and an output latch for outputting data. Thus, the cycle time cannot be shortened because of this delay time. In the above-mentioned synchronous memory device with two levels of latches, the output latch is provided just before the output buffer. Thus, the delay time between the input latch and the output latch cannot be made smaller even if an address access time (i.e., a time period from inputting an address signal to outputting data) is shortened. As a result, there exists a problem that the cycle time cannot be made short.

In Japanese patent laid-open print 64-21786, the cycle time is shortened by reducing the delay time between the latches with an intermediate latch. The cycle time becomes shorter in this synchronous memory device with three latches, but this device is not without its problems. One problem, for example, is that the address access time becomes longer because an additional latch is inserted in the path from the address input to the data output. Another problem is that both the number of latches and the chip area is significantly large, since the latches are provided in the parts where a lot of signal lines such as word lines are formed.

SUMMARY OF THE INVENTION

An object of this invention is to provide a synchronous memory device which can achieve a short cycle time without requiring additional latches. Another object of this invention is to provide a synchronous memory device having shorter address access and cycle times compared with conventional synchronous memory devices. Another object of this invention is to provide a synchronous memory device having a chip area of reduced size while using a latch circuit to shorten the cycle time.

In this invention, in order to shorten cycle time, a plurality of output latches are provided in every sense amplifier to thereby amplify an output electric potential of the signal of the bit line that is output from the memory cell. This output latch is not provided between the selector and the output buffer, but between the memory cell array and the selector. To shorten the address access time, latches are not provided on the paths that determine the address access time from the address decoder to the memory cell array.

In addition, in order to store several kinds of data read from the memory cell array in the latch and to select specified data from these latches by means of a selector, a selection signal latch for storing and outputting selected signals which designate latches or data to be selected by clock signals is disposed in a path for storing the selected signals, which is different from a path from the address buffer to the outputting latch. Because the cycle time of the synchronous memory device is decided by the delay time of data in the circuit between two latches, the cycle time of the synchronous memory can be shortened by shortening the delay time.

In this invention, because several output latches are provided in every sense amplifier to amplify output electric potential of the signal of the bit line that is output from the memory cell, and these output latches are provided between the memory cell array and the selector, the delay from the input latch to output latch can be shortened. Therefore, the synchronous memory device with a cycle time is achieved.

Further, because no latch is provided in the path that determines the address access time from the address decoder to the memory cell array, the address access time and the cycle time can be shortened. As a result, a synchronous memory device that is high speed can be achieved.

In addition, because a selection signal latch is provided in a path that is different from the path between the address buffer and the output latch, the selection signal is stored in a selection signal latch even if the state of the decoder for generating selected signals changes to the non-selected state. Therefore, the data storing time of the output latch is not limited by the state of a decoder. As a result, even if the cycle time is short, the storing time of data output from the outputting latch can be sufficiently secured.

Further, because an intermediate latch for storing and outputting the output of the address decoder is not used, increases in the chip area is suppressed. As a result, an increase in the cost of the synchronous memory device can be suppressed and the complexity of the circuit can be avoided by providing latches.

DETAILED DESCRIPTION OF PREFERRED EMBODIMENTS

Conventional memory devices are undesirable because their cycle time is long. As a general method for solving this problem, it has been known to make the synchronous memory device input and output data synchronously with a clock signal that is different from a signal used to specify an address signal.

Figure 2:
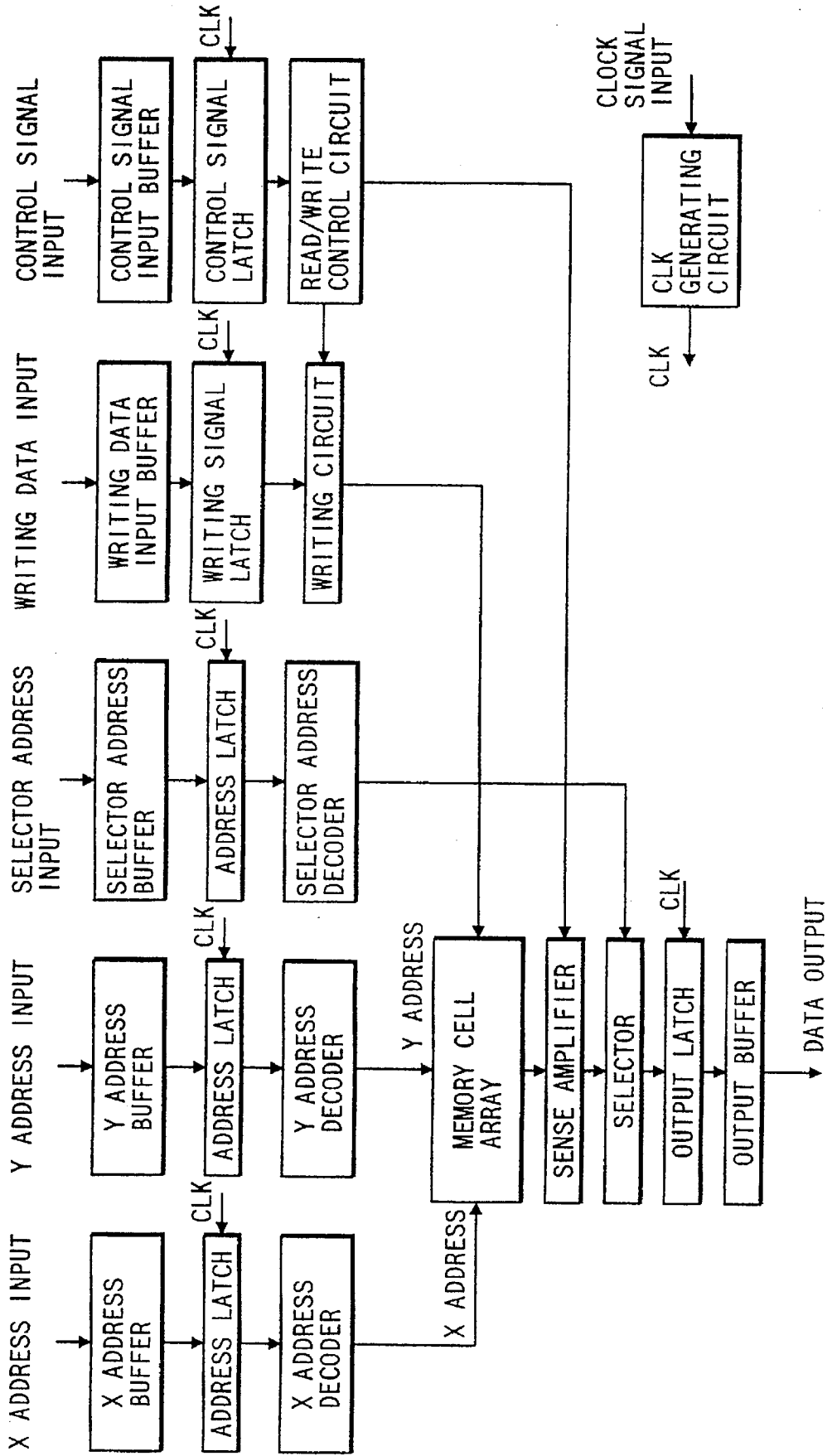
FIG. 2 is a schematic diagram of a synchronous memory device of conventional technology.

FIG. 2 shows a schematic diagram of a conventional synchronous memory device. An address signal input to an address buffer is converted into a decoder output from a memory cell specified by the address decoder and the data in the selected memory cell is read by a sense amplifier. The decoder output also specifies the sense amplifier to be selected. The data in the specified sense amplifier is output from the memory device through an output buffer.

In the synchronous memory device mentioned above, a clock signal other than the address signal is input from the outside of LSI. An address signal, a chip selection signal, a writing enable signal, a data input signal, etc. are input, synchronizing with this clock signal to output the data output signal.

The cycle time is defined as a period of time between data outputs. A quantity of data output from the memory device per unit time increases with a decrease in cycle time. The cycle time of the synchronous memory device is generally limited by the maximum delay time between the input latch for storing the data of the address signal, the chip selection signal, etc. and the output latch for outputting data. The cycle time cannot be made shorter than this delay time.

Figure 3:
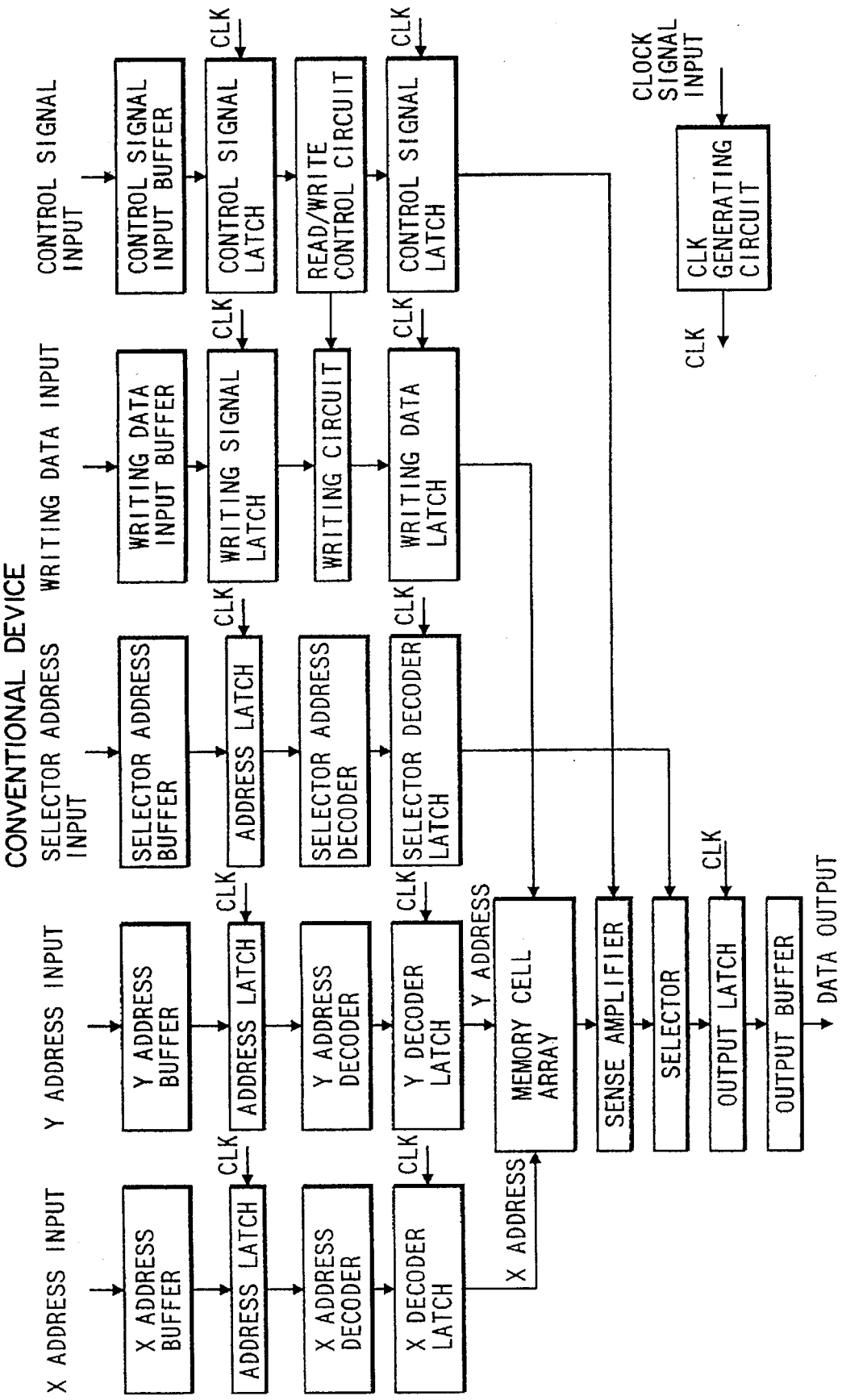
FIG. 3 is a schematic diagram of a synchronous memory device of a conventional technology.

In the conventional synchronous memory device shown in FIG. 2, the output latch is provided just before the corresponding output buffer. Therefore, because the delay time between the input latch and the output latch is large, there is a problem that the cycle time cannot be made short, compared with the address access time. In order to solve this problem, there has been proposed a method of reducing the delay time among latches to shorten the cycle time by providing an intermediate latch which is different from the input latch and the output latch in the output of the decoder. This structure is shown in FIG. 3. An example of this method is described in Japanese patent laid-open 64-21786. According to this method, the cycle time is shortened. However, it is necessary to insert additional latches in the path between data outputting and the address inputting. Therefore, this approach has proven to be undesirable because the address access time (i.e. the time period between inputting of an address signal and outputting data) is long. Further, because the latches are provided at the place where a lot of signal lines are formed, the number of latches becomes large and the occupying area on the chip becomes large as well.

Figure 8:
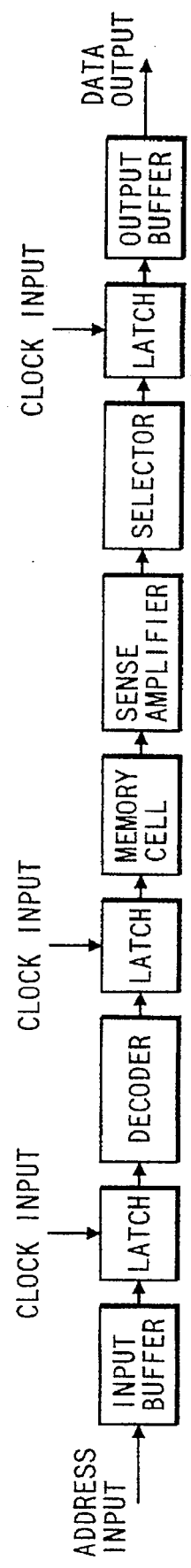
FIG. 8 is a block diagram showing data flows between circuit blocks in a conventional synchronous memory device.
Figure 9:
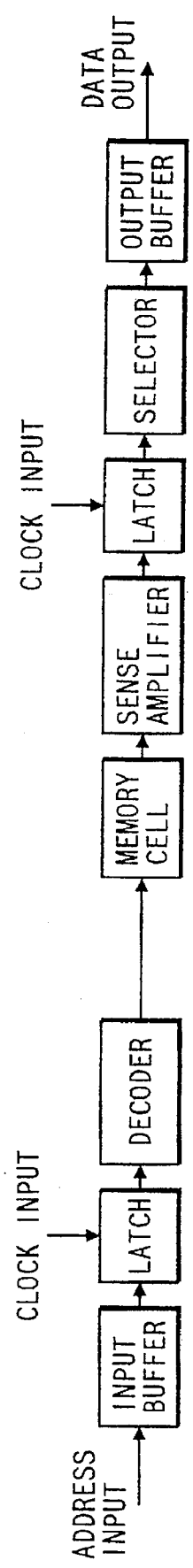
FIG. 9 is a block diagram showing data flows between blocks in the synchronous memory device of the present invention.

The synchronous memory device of the present invention and a conventional device (Japanese patent laid-open 64-21786) are compared in FIG. 8 and FIG. 9. These figures illustrate how data flows inside of the memory LSI from a time after inputting of an address signal into the memory LSI to a time of outputting the data. FIG. 8 shows data flows between blocks in a conventional memory LSI. While the selector circuit is not shown in the figure, it is the premise in this device that an output latch is provided just before the output buffer. Therefore, in the case where a selector function is provided, as shown in FIG. 8, the selector is provided just before the output buffer. Latch circuits for storing internal information are installed in the signal output part of the address input buffer, signal output part of a decoder and sense amplifier signal output part. Since the minimum cycle time within which an SRAM can operate is decided in the delay time between latch circuits, it is possible to realize a cycle time shorter than the delay time between inputting of an address into an address input buffer and outputting of data from the output buffer. However, because latches are provided in the output part of the decoder where the number of signals is very large, this method needs a lot of latch circuits. Therefore, in the case where memory scale is large, it is difficult to realize a high-speed cycle. That is, an increase of a memory layout area leads to an increase of the delay time of signal transmission in long wirings. As a result, a high-speed cycle time can not be realized.

FIG. 9 shows, in contrast with FIG. 8, the block diagram of the memory LSI of the present invention. The address signal that is input into an input buffer is latched by an address latch. The data in the memory cell corresponding to this data are read by a sense amplifier. Then, the data are latched to an output latch. The selector selects a latch, and the data in this latch is output.

It is a feature of the present invention that the output latch which was provided just before the output buffer in the conventional device is provided before the selector that is located before than the path so that the output latch is selected. When the latch provided in the decoder output part in FIG. 8 is removed, the delay time of a signal propagation between the address latch and the output latch becomes large so that the cycle time becomes long. In the present invention, the output latch is moved to the position before the selector in the data path, which location is more on an upstream side, thereby having the effect of repressing the elongation of the cycle time. The delay time between the address latch and the output latch is thereby substantially shortened, consequently leading to shorten the cycle time. Therefore, according to this invention, it is possible to realize a memory LSI with a short cycle time in a layout area smaller than that of a conventional memory LSI because it is not necessary to provide latches in the output part of the decoder, etc. where the number of signals is very large.

Figure 10:
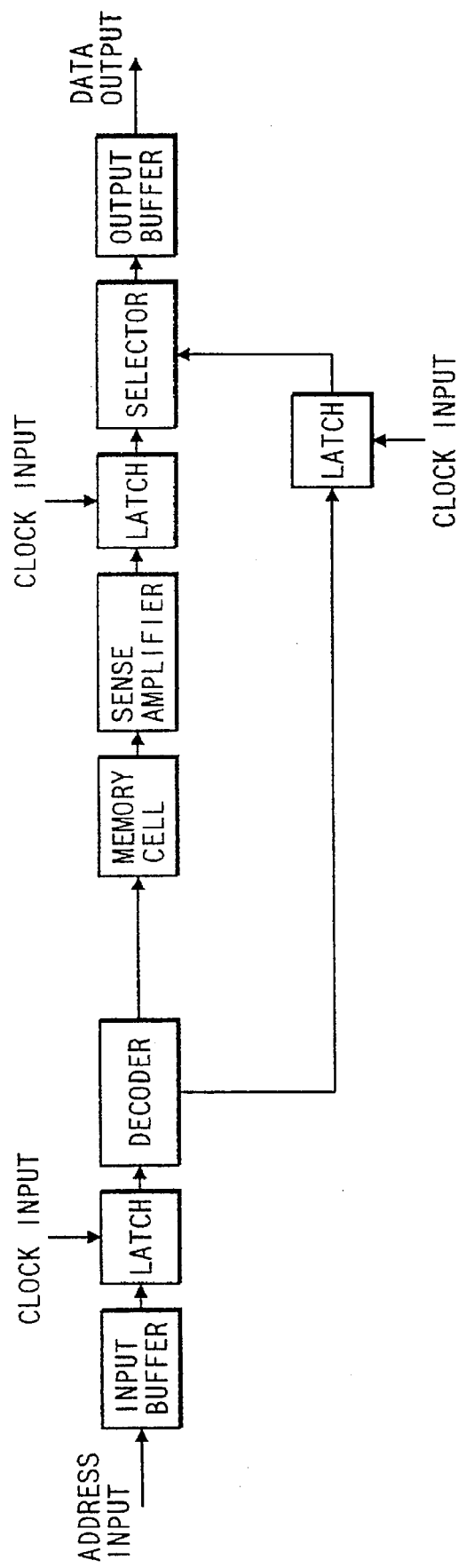
FIG. 10 is a block diagram of an embodiment of the present invention.

FIG. 10 is a block diagram of the device in which a means for selecting the selector is added to the device in FIG. 9. A signal that is a decoder signal stored in the latch is used as a selection signal to decide the latch to be selected by the selector. As a result, the selection signal of the latch becomes valid in the term during which the memory cell data which is the output from the latch and input into the selector is valid, whereby a normal operation is guaranteed.

An example of the synchronous memory device of this invention is explained with reference to FIG. 1. For the sake of simplification of the explanation, this figure shows the case of one bit output. A memory device of multi-bit output can be realized by increasing the number of circuits that are arranged in parallel to the circuit shown in the figure. A memory cell array is contained in the memory device. The memory cell array comprises plural lines and columns. The intersection point of one line and one column corresponds to one memory cell. The memory cells that belong to the same column shares the data bus that is called a bit line. This is called one of which the Y addresses are the same. The memory cells that belong to the same line are called memory cells with the same X addresses.

In the simplest case, by specifying the X address and the Y address, the memory cell of the intersection point is selected. In some case, the inside of the memory cell array is divided into several blocks. For example, there is a case that four sets of bit lines correspond to the same Y address. In this case, all of four intersection points are selected by giving the X address and the Y address, and the information of four bits is output from the memory cell. The block diagram of FIG. 1 is the figure in this case. To specify one of these several memory cells, three kinds of addresses, that is, a X address, a Y address and a selector address are input from the outside of the memory device. The selector address is sometimes called a Z address. The selector address is used to specify one bit selected from the four bits information in the above example.

The signals that are input from the outside of the memory device are a chip selection signal (CS), a writing enable signal (WE), a writing data signal (Din) and a clock signal (CLK), except for the memory cell address. Both of the chip selection signal and the writing enable signal are sometimes called control signals. The signal output to the outside of the memory device is a read data output signal (Dout) of the memory cell.

A plurality of components of the memory device are grouped into the circuit blocks described below. Each circuit block is shown by a rectangular box in FIG. 1. To process input address signals in the memory device, the address buffer circuit converts a voltage level, etc. The address latch circuit stores the address signals of outputting of the address buffer circuit. There are provided input buffer circuits each corresponding to each of the CS signal, the WE signal and the DIN signal and input latch circuits accompanying with these input buffer circuits. Also, there are provided input buffers for inputting a clock signal (CLK) that becomes a standard of the operation of these input latch circuits and a clock generation circuit that generates the various clock signals used in the memory device from the output signal of the clock signal input buffer.

Further, the following elements are provided: address decoder circuits for decoding the output signals of the address buffer circuits; sense amplifier circuits for amplifying, the memory cell output signals; output latch circuits for holding the data of the sense amplifier circuits; a selector circuit for selecting one that should output from several sense amplifier circuits and several output latch circuits; and an output buffer circuit for outputting the data that should be output to the outside of the memory device.

Figure 1:
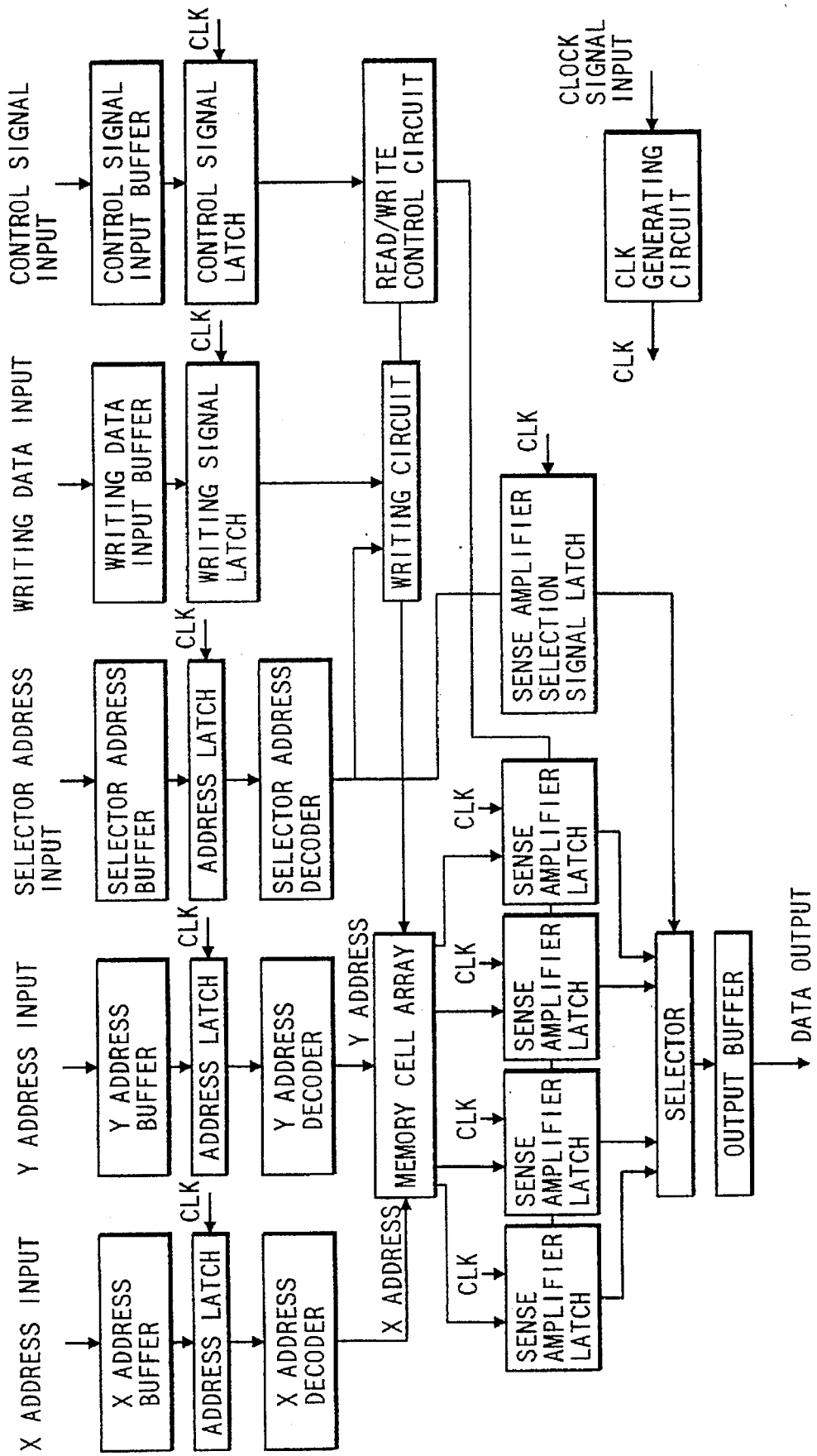
FIG. 1 is a schematic diagram of the synchronous memory device of the present invention.

One of the sense amplifier circuits and the corresponding output latch circuit are represented as one block in FIG. 1. In this block, the output latch circuit is provided at a position of either before the sense amplifier or after it. Memory cell signals are sometimes amplified in the preceding position or the back position of the selector circuit which is provided after the sense amplifier. This is called a main sense circuit in this case. The latch circuit for selecting the sense amplifier continues selection of the sense amplifier and the latch circuit until the following clock signal is input, even if the selection signal of the sense amplifier becomes invalid.

Figure 4:
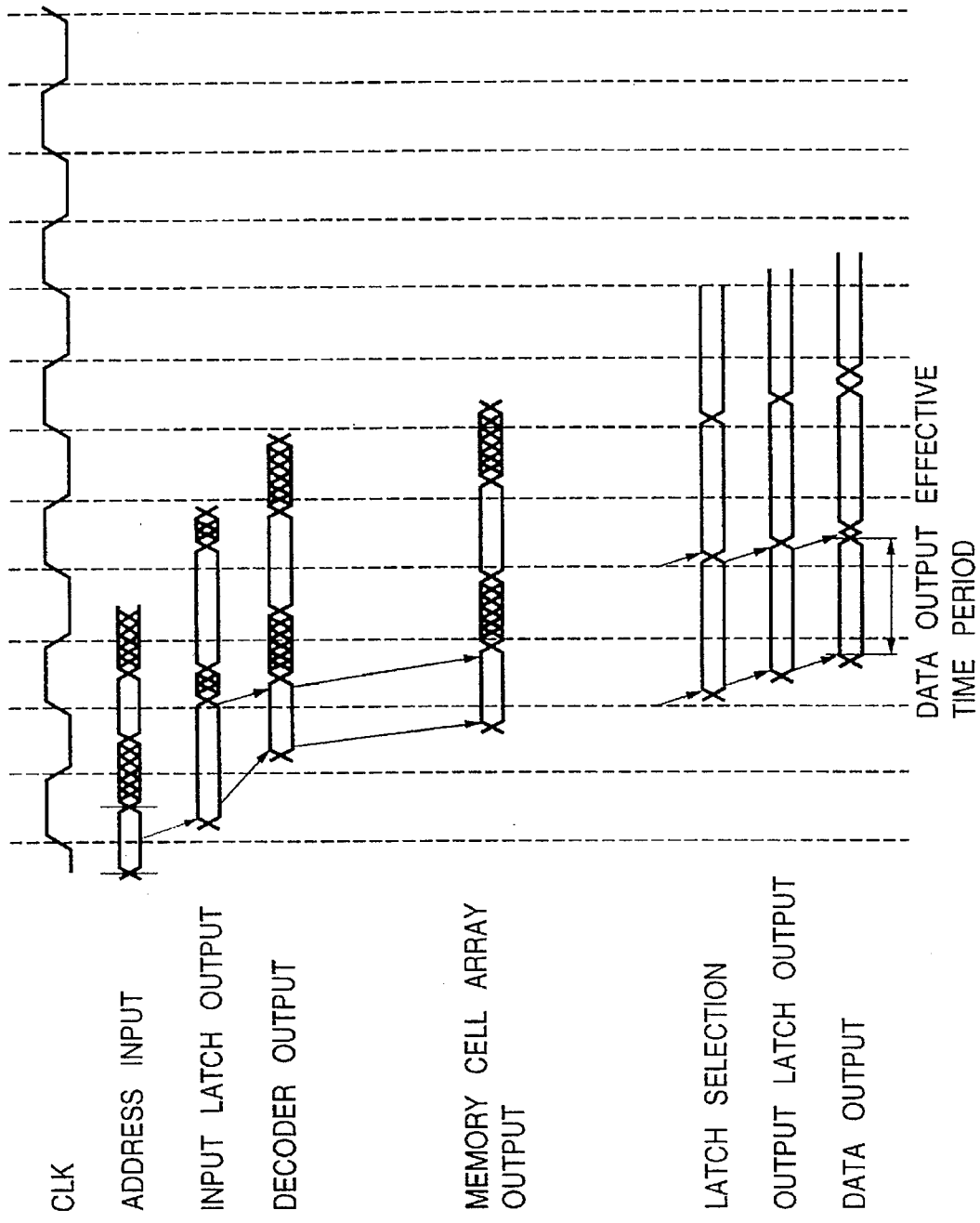
FIG. 4 is a timeline showing operation timing of the synchronous memory device of the present invention.

FIG. 4 shows an example of operation timing of this circuit. In this figure, time passes as moving to the right direction. On each line, there is shown an electric potential change at the nodal point (node) indicated on the left side. In case of the example of FIG. 4, the input signals such as the address signals are taken into the memory device at the rising edge of the clock signal CLK. In some cases, the input signals are taken into the memory device at the falling edge of the clock signal CLK. The address signals taken into through the input buffer circuits are input into the address latches. The address signals become valid for the memory device near the rising edge of the CLK signal that is specified by setting-up and storing characteristics. The address signals input at the time outside this range have no relation with the internal operation of the memory device. The input latch has a function for holding the introduced address information until the time when the next clock signal rises. Output of the input latch becomes valid until the next rise of the CLK signal in FIG. 4. The situations are same for the X address latch, the Y address latch, the selector address latch, the writing data latch and the control signal input latch. Output of the input address latch is input into each of the decoder circuits.

The decoder circuit decodes the input address signal expressed by the binary number to convert it into the signal to access the memory cell and transfers the signal to the memory cell array. The decoder circuit begins to operate after outputting data from the input latch. In case where the memory device is used, there is almost no difference in AC characteristics specifications among the kinds of addresses (X, Y, and selector). Therefore, it is necessary to drive all of these input latches by the same clock signal CLK.

In the example of FIG. 1, outputs of the X address decoder and Y address decoder can simultaneously access the four memory cells in the memory cell array, wherein the X address decoder is input in the memory cell array. The number of the memory cells that are accessed simultaneously is four, for the sake of simplification in this example. This number is larger in actual cases, and there is even a case of 256 or 1024.

The data of four memory cells which are output to four sets of bit lines from four memory cells are input into the circuit blocks of the sense amplifiers and the output latches. The circuit block of the sense amplifier latch latches and outputs a bit line signal which is input at the rising time of the clock signal. This signal is stored in the output latch until the next rising time of the clock signal. Therefore, the decision of the final data is relatively specified from the input time of the clock next to the clock by which an address is input. Further, the output data are stored until the next rising time of the 3rd clock (the time period that is decided by the 3rd clock). That is, the output data are stored for the period time shown by the data storing time in FIG. 4.

In the followings, for the purpose of the explanation, the clock rising times for giving timing of inputting data are referred to as the first clock rise time, the second clock rise time after the first clock rise time, and the third clock rise time, etc., respectively. As it is seen from the above explanation, it is necessary that the data are stored in the same sense amplifier latch circuit block from the second clock rise time to the third clock rise time. Even if the output latch stores correct data, correct data can not be expected when the output latch is changed. Likewise with other address decoders, the selector address decoder is in a hold state for a time period from the first clock rise time to the second clock rise time.

The block of the sense amplifier selection latch in FIG. 1 latches this signal at the second clock rise time and holds it until the third clock rise time. Because the output of this block is held until the third clock rise time, output of the output latch is also held until the third clock rise time. A latch which takes in input data such as addresses at the edge of a clock signal and holds the output till the next clock signal is called a register type (the R type) latch. The output latch is the register type in this example. Therefore, the synchronous memory device of this example is sometimes called the R/R type. There is also an L type latch besides the R type latch. The synchronous memory device of the R/L type using the L type latch is described later.

The writing data signal is input into the corresponding latch at the first clock rise time and the writing to the memory cell in the memory cell array finishes by the second clock rise time. This is because writing to the memory cell during the period in which the X address and the Y address are valid. The control signal is also latched to the corresponding input latch at the first clock rise time and held till the time decided by the second clock rise time. A cycle operation which starts at the first rise time is determined by the control signal to decide the operation as either reading data or writing data. The control signal decides the operation of the sense amplifier and the writing circuit in this cycle.

The cycle time in this embodiment is decided by the time of inputting the first clock signal, that is, a necessary time period from the time at which the address signal is input to the time at which the memory cell data are latched in the output latch. Because the output latch is disposed to the sense amplifier of the bit line in this embodiment, the delay time becomes shorter than the case where an output latch is provided in the neighborhood of the output buffer like the conventional technique shown in FIG. 2 so that the cycle time becomes shorter than that of the conventional one.

In this embodiment, it is not necessary to provide the latches with the final stage of X decoders such as word lines, for example, where the area of the synchronous memory device may be increased because of large number of latches. As a result, an occupying area of the memory device should be small to the same level as that of the conventional memory device.

Generally, the data path to the word line through the X decoder determines the access time of the memory device. In this embodiment, since additional latches are not needed in this path unlike the conventional technique shown in FIG. 3, an increase of the access time is minimized.

Figure 5:
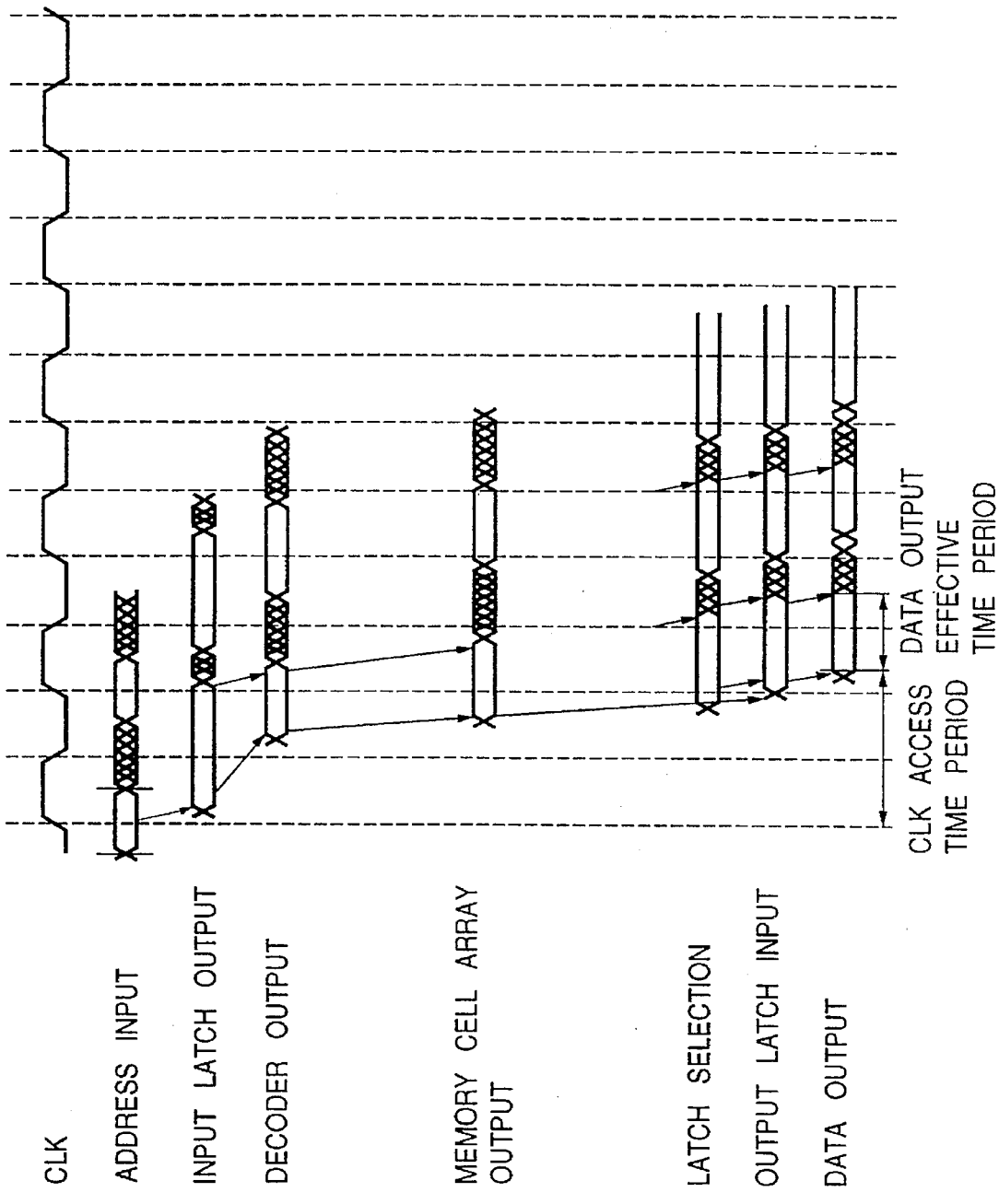
FIG. 5 is a timeline of the operation timing of the synchronous memory device of the present invention.

In FIG. 5, an example of another operation timing of the memory device in FIG. 1 is shown. In this operation, the input time of the address data, etc. is not specified at the rising edge of the clock signal, unlike the case where the output latch is the register type shown in FIG. 4. In this latch, the output is held in the case where the clock signal is Low and the input signal is output when the clock signal is High (L type). That is, the latch of the R type maintains the output from a rising edge of the clock signal to the following rising edge. However, the latch of the L type maintains output only when a clock signal is High. However, when the input changes while the clock signal is Low, the output also changes as it is. Therefore, the delay time from latch input to output becomes shorter than that of the R type.

The operation timing of FIG. 5 shows an example of the L type output latch. The output of the output latch is relatively specified by the second clock rise time in the example of FIG. 4, but in the example of FIG. 5 the output is determined by the decoder output in the memory device, that is, by the first clock. Since the time of starting the outputting of data from the first clock is the access time on the basis of the clock signal, this time is the clock access time. In this case, it is necessary that the sense amplifier selection latch is also the L type as shown in FIG. 5. In the case where the output latch is the L type and the clock signal is Low, the output of the latch changes depending on the input. The memory device having the structure shown in FIG. 5 is sometimes called the R/L type. An advantage of this type is that the absolute value of the time period from inputting an address to outputting data from the memory device (clock access time) is smaller than that of the R/R type.

Figure 6:
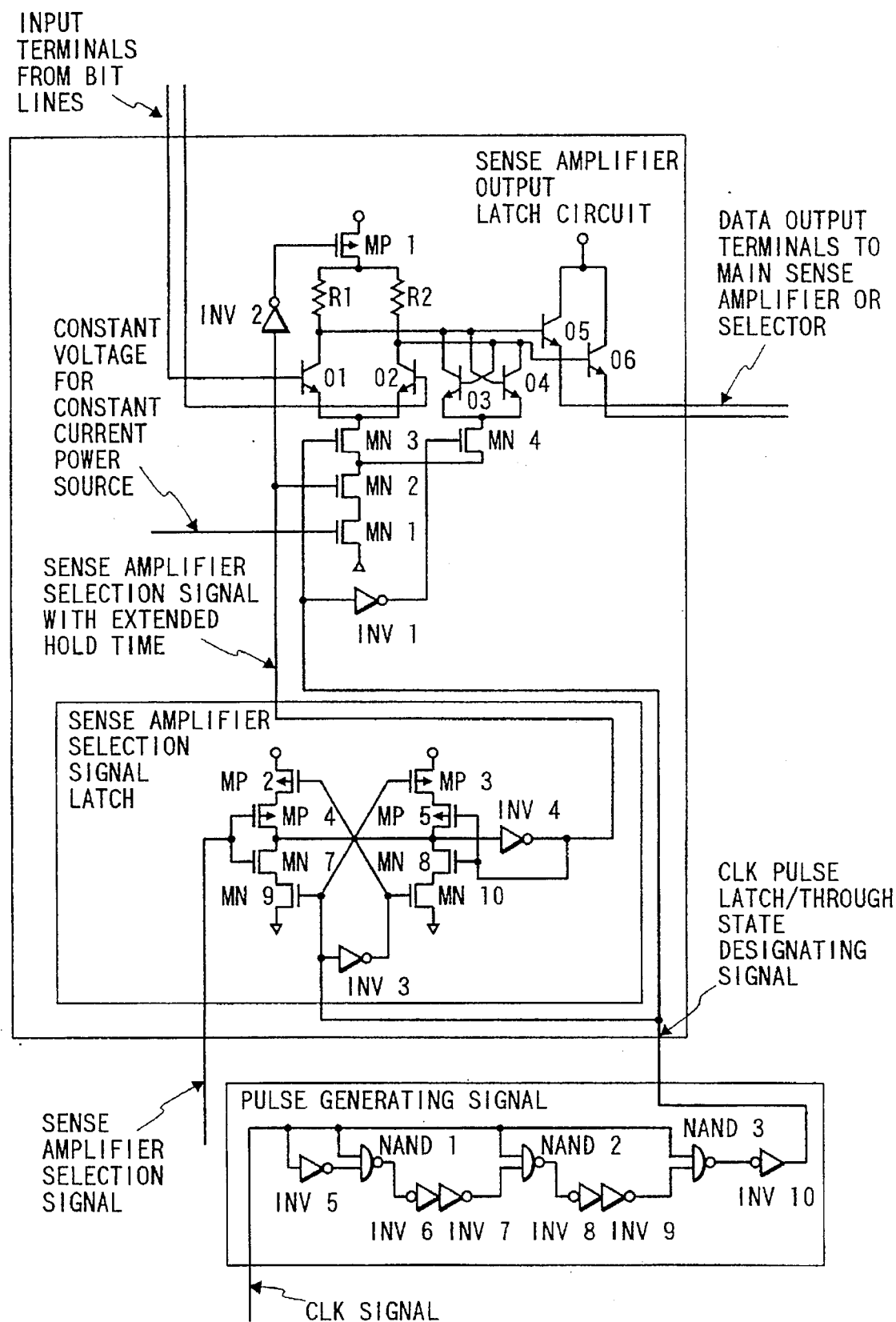
FIG. 6 is a circuit diagram of a sense amplifier and an output latch employed in the synchronous memory device of the present invention.

An example of the sense amplifier-output latch circuit and the sense amplifier selection signal latch circuit in FIG. 1 is shown in FIG. 6. This circuit is constituted by a BiCMOS circuit, that is, the circuit using bipolar transistors and MOS transistors. As shown in FIG. 6, there are the cases where the output buffer is provided in the sense amplifier and a latch circuit is provided in the bipolar differential amplifier of the first stage. In the latter, the latch is provided before the first stage, that is, before an amplification of the signal.

At first, the memory cell data that is input from the bit line is input into the amplifier circuit comprising a differential pair of the bipolar transistors Q1 and Q2. The differential pair of Q1 and Q2 complementarily operates with the latch circuit including the bipolar transistors Q3 and Q4. Therefore, this circuit takes either one of two states. One of the states is that the data of a bit line is output as it is. The other is that the latched data is output independently of the state of the input terminal.

However, in the case where this sense amplifier-latch circuit is not selected, that is, the sense amplifier selection signal and the holding time are prolonged to be Low, MOS transistors MP1 and MN2 turn OFF and electric potentials of the data output terminals of complementary outputs also lower together. Therefore, the constitution of wired-or logic becomes possible by connecting outputs of sense amplifier circuits that are similar ones.

MOS transistors MP2, MP3, MP4, MP5, MN7, MN8, MN9 and MN10 and inverters INV3 and INV4 constitute the latch circuit of the sense amplifier the selection signal. That is, the sense amplifier selection signal at the time that a positive pulse is given to the CLK pulse node is held in the output terminal and latched until the next change of the CLK pulse node. Either one of the inverters comprising MP4 and MN7 or one comprising MP5 and MN8 is always ON by INV3, MP2, MN9, MP3 and MN10. In case of the inverter comprising MN4 and MN7, an input signal is output as it is. In case of the inverter comprising MP5 and MN8, the data latched on this inverter and INV4 are output independently of the input signal. When the node of the CLK pulse is Low, latch is in the through-state, that is, the state where the pass between the input and the output is conductive. When the node of the CLK pulse is High, the latch outputs the latched data independently of the state of the input terminal, that is, the latched state.

The pulse generation circuit in FIG. 6 is the circuit for generating the CLK pulse signal that is used in the sense amplifier-latch circuit from the CLK clock signal distributed in the memory device. In the case where the CLK pulses are distributed in the memory device by the use of the pulses that occur in the PLL circuit, the function of the above mentioned circuit is not needed. This circuit is composed of inverter circuits INV5–INV10 and NAND circuits NAND1–NAND3. In the case where CLK is held in the Low state or the High state, the CLK pulse node becomes Low, and the latched data are output to the output of the sense amplifier selection signal latch. When CLK changes from Low to High, positive pulses are generated in the CLK node, and during this period of time, the sense amplifier-latch and the sense amplifier selection signal latch become through states.

Figure 7:
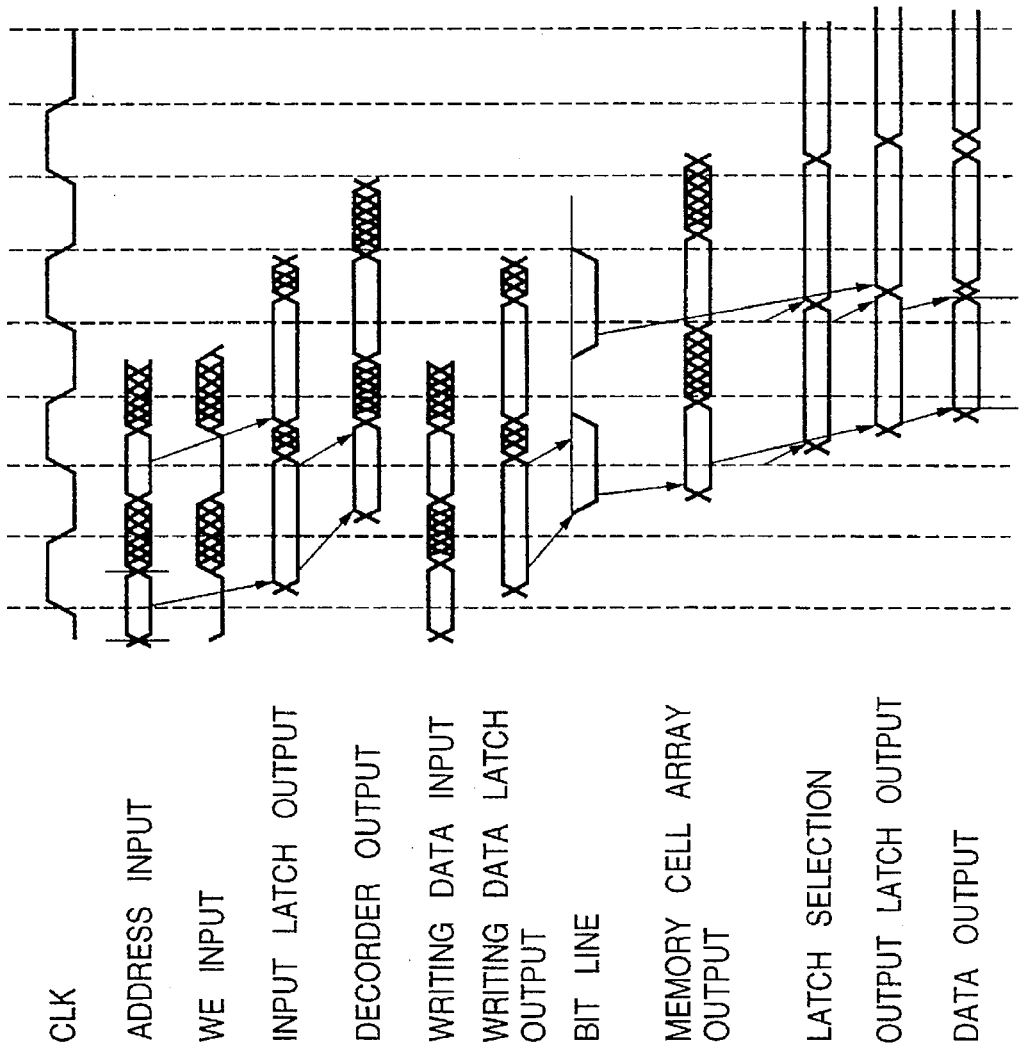
FIG. 7 is a timeline operation timing at the time of writing in the synchronous memory device of the present invention.

An example of the writing operation of the memory device of this invention is explained by using FIG. 7. The address which is written in at the time of the first clock is set in the cycle for the writing operation so that the WE input signal is made Low to set the writing data. The address signal is stored until the input time of the second clock signal by the latch in the same way as the reading time. The WE input signal is stored until the input time of the second clock signal. Further, the writing data are stored in the input latch. A writing circuit is operated by the signal WE and input writing data are written into the memory cell of the specified address. At this time, the information about the selector address is also supplied to the writing circuit and the data are written into the selected memory cell only.

The timing of the bit line of the memory cell into which the data are written is shown in FIG. 7. The written data can be output to the outside of the memory system in the same way as the case where the reading operation is performed via the ordinary reading path, as is shown in FIG. 7. Timing in this case is shown in FIG. 7.

Figure 11:
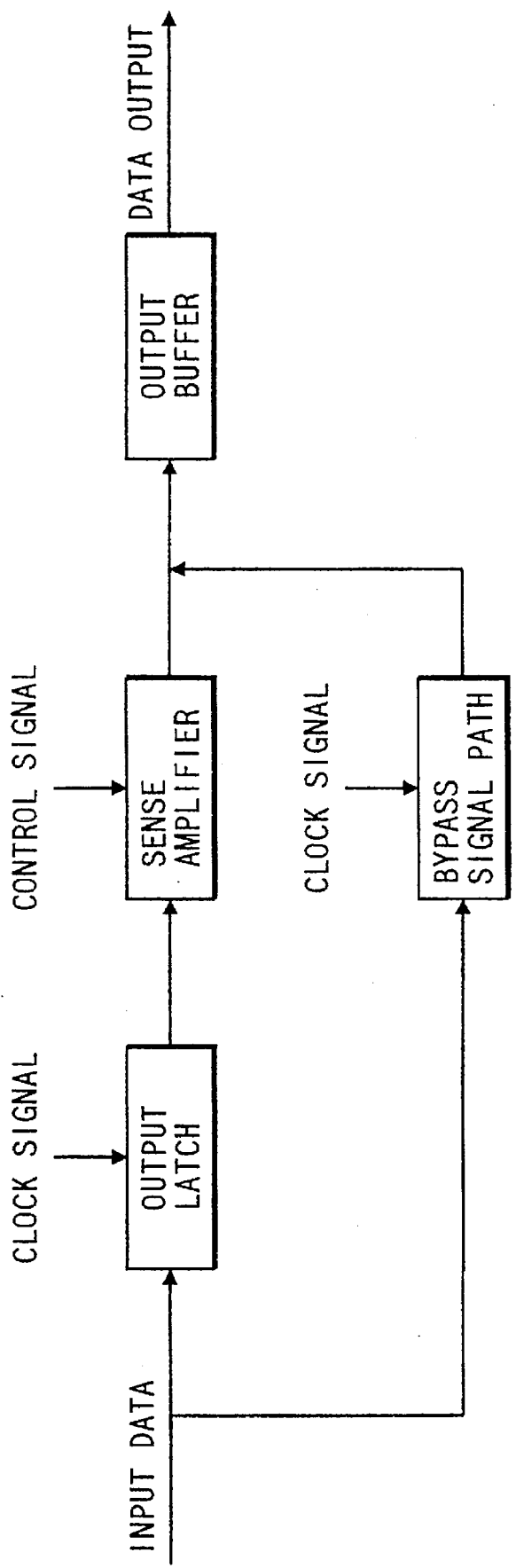
FIG. 11 is a block diagram showing a method for shortening the clock access of this invention.

An example of the memory device to which this invention is applied is shown in FIG. 11. The sense amplifier circuit is connected to the output of output latch. The data of the output latch is output to the output buffer through this sense amplifier circuit. The time at which the data are to output to the output buffer is decided on the basis of the time of the clock signal input into the output latch circuit. The time period between inputting a clock signal from the outside and outputting data from the output buffer is called a clock access time. To shorten the clock access time, the number of steps of circuits comprising the clock signal input step through data output step should be decreased.

If this invention is not applied wherein no signal bypass route in the figure is employed, the output becomes valid by the clock signal input into the sense amplifier-latch circuit. Then, the data processed by the sense amplifier is output via the output buffer. To make the clock access time shorter than that of this case, the signal route that transmits the input signal to the output buffer from the input of the sense amplifier latch circuit and bypassing the latch and the sense amplifier has to be prepared. The data is output on the basis of the time of the clock signal input into the bypass signal circuit. When a clock signal is input, the input data of the sense amplifier are first input into the output buffer through the bypass signal circuit. After the output of the sense amplifier circuit changes, the signal route is returned to an ordinary path from the bypass. As a result, it appears that the clock access becomes fast. The control signal that is input into the sense amplifier circuit switches the control that changes the path into the route containing the latch from this bypass route.

As it was explained in the above, the number of the logical steps from the clock signal input to the data output decreases, compared with the case where the bypass signal route is not prepared, this embodiment has an advantage that the clock access time from the clock signal input to the data output can be shortened more.

According to this invention, the memory device which has the cycle time much shorter than that of the conventional memory device can be realized.

What is claimed is:

1. A synchronous memory device comprising:

at least one input buffer for storing input address data;

at least one input latch for outputting the address data stored in said input buffer in accordance with a clock signal;

at least one decoder for decoding the address data output from said at least one input latch;

a memory cell array having a plurality of memory cells, said memory cell array outputting data stored in said plurality of memory cells through bit lines based on decoding performed by said at least one decoder;

at least one sense amplifier for amplifying data signals corresponding to the data output through said bit lines;

at least one output latch for outputting the data signals amplified by said at least one sense amplifier in accordance with the clock signal;

a selector for selecting one data signal from the data signals stored in said at least one output latch; and an output buffer for outputting the data selected by the selector, wherein said at least one output latch is provided between said at least one sense amplifier and said selector.

2. A synchronous memory device comprising:

a plurality of input buffers for storing input address data;

a plurality of input latches for outputting address data stored in respective ones of said input buffers in accordance with a clock signal;

a plurality of decoders for decoding, respectively, address data output from said plurality of input latches;

a memory cell array having a plurality of memory cells, said memory cell array outputting data stored in said plurality of memory cells through bit lines based on decoding performed by the plurality of decoders;

a plurality of sense amplifiers for amplifying data signals output through the bit lines;

a selection information latch for outputting, on the basis of the clock signal, selection information to select one of the data output from said memory cell array on the basis the decoding performed by said plurality of decoders;

a plurality of output latches for outputting the data signals amplified by respective ones of said plurality of sense amplifiers in accordance with the clock signal;

a selector for selecting one of the data signals output from the plurality of output latches in accordance with the selection information output from the selection information latch; and an output buffer for storing and then outputting the data selected by the selector, wherein said plurality of output latches are provided between respective ones of said plurality of sense amplifiers and said selector.

3. A synchronous memory device comprising:

an X address input buffer for storing an X address of a memory cell array;

a Y address input buffer for storing a Y address of the memory cell array;

a selector address input buffer for storing selector addresses for specifying a predetermined number of data from a plurality of data specified by the X address and the Y address;

an X address input latch for outputting the X address stored in said X address input buffer in accordance with a clock signal;

a Y address input latch for outputting the Y address output from the Y address input buffer in accordance with the clock signal;

a selector address input latch for receiving the selector addresses from said selector address input buffer in accordance with the clock signal;

an X address decoder for decoding X address output from said X address input latch;

a Y address decoder for decoding Y address output from said Y address input latch;

a selector address decoder for decoding the selector addresses from said selector address input latch;

a memory cell array for reading and writing data through a bit line from the position specified by decoding the X address with the X address decoder and decoding the Y address with the Y address decoder;

a sense amplifier for amplifying data signals corresponding to data output from said memory cell array for the respective bit lines;

an output latch for outputting the amplified data signals from said sense amplifier in accordance with the clock signal;

a selector address latch for outputting, on the basis of decoding of a selector address decoder, a selector address to select one of the data signals stored in the memory cell array on the basis of the clock signal;

a selector for selecting one of the data signals held in said output latch on the basis of the selector address output from said selector address latch; and an output buffer for outputting the data selected by said selector, wherein said output latch is provided between said sense amplifier and said selector.

4. The synchronous memory device recited in claim 1, wherein said at least one decoder is connected to said memory cell array without latches disposed therebetween.

5. The synchronous memory device recited in claim 2, wherein said plurality of decoders are connected to said memory cell array without latches being disposed therebetween.

6. The synchronous memory device recited in claim 3, wherein said X decoder and said Y decoder are connected to said memory cell array without latches being disposed therebetween.

* * * * *